(12) United States Patent
Hollingworth

(10) Patent No.: US 6,556,000 B2
(45) Date of Patent: Apr. 29, 2003

(54) FAST EDGE GENERATOR WITH WIDE DYNAMIC RANGE

(75) Inventor: Simon Timothy Hollingworth, Norfolk (GB)

(73) Assignee: Fluke Precision Measurement LTD (GB)

(*) Notice: Subject to any disclaimer, the term of this patent is extended or adjusted under 35 U.S.C. 154(b) by 78 days.

(21) Appl. No.: 09/737,286

(22) Filed: Dec. 13, 2000

(65) Prior Publication Data

US 2001/0005131 A1 Jun. 28, 2001

(30) Foreign Application Priority Data

Dec. 14, 1999 (GB) ............................................... 9929418

(51) Int. Cl.[7] .................... G01R 23/00; G01R 35/02; G05F 1/648; H03K 17/00; G01M 19/00
(52) U.S. Cl. ................... 324/76.19; 324/74; 324/601; 323/297; 327/99; 327/298; 702/124
(58) Field of Search .................... 324/76.19, 76.41, 324/601, 74, 603, 616; 702/85, 90, 124; 331/182; 323/297, 354; 327/291, 99, 298

(56) References Cited

U.S. PATENT DOCUMENTS

| | | | | |
|---|---|---|---|---|
| 3,569,677 A | * | 3/1971 | Bray et al. ................ | 340/146.2 |
| 4,482,863 A | * | 11/1984 | Auston et al. ............. | 324/765 |
| 4,538,122 A | * | 8/1985 | Szabo et al. ............. | 331/107 DP |
| 5,621,310 A | | 4/1997 | Cosgrove et al. .......... | 324/74 |
| 5,821,828 A | * | 10/1998 | Dijkmans ................. | 331/109 |
| 5,905,646 A | * | 5/1999 | Crewson et al. ........... | 363/132 |
| 5,920,187 A | * | 7/1999 | Cosgrove et al. .......... | 324/601 |

* cited by examiner

*Primary Examiner*—N. Le
*Assistant Examiner*—Anjan K. Deb
(74) *Attorney, Agent, or Firm*—Bourque & Associates, P.A.

(57) ABSTRACT

The electronic calibration equipment for verifying the high frequency characteristics of electronic test equipment, including oscilloscopes arid time interval analyzers is provided. An electronic circuit (40) for generating an electronic fast edge waveform (109, 110) of selectable amplitude comprises: a waveform output (102) from the circuitry; a plurality of attenuation stages (124–127), the attenuation stages being connected without any switching elements to each other to form a cascaded series of attenuation stages leading to the waveform output (102) and each of the attenuation stages (124–127) in the series being bounded by circuit nodes (115, 132, 133, 134, 135); one or more pulse generators (105) for producing an unattenuated source of the fast edge waveform (105, 106); and structure selectively applying the fast edge waveform source to a corresponding selected one of the circuit nodes so that the fast edge waveform propagates from the selected circuit node (115, 132, 133, 134, 135) through a selected number of attenuation stages (124–127) to the waveform output (102) thereby attenuating the fast edge waveform (109, 110) to a selected amplitude.

10 Claims, 3 Drawing Sheets

FAST EDGE GENERATOR WITH WIDE DYNAMIC RANGE

BACKGROUND a. Field of the Invention

The present invention relates to electronic calibration equipment for verifying the high frequency characteristics of electronic test equipment, including oscilloscopes and time interval analyzers.

b. Related Art

In order to verify the high frequency characteristics of electronic equipment such as oscilloscopes, it is necessary to use a test signal generator that provides square edge test signals that have edges with a rise time and/or fall time at least as fast as the oscilloscope's specified rise time and/or fall time. The test signal should have aberrations from an ideal square edge significantly better than the specification of the equipment being tested. A complication arises with test equipment such as a conventional oscilloscope (rather than a sampling oscilloscope) that has a wide dynamic range at its input. Conventional oscilloscopes have inputs with selectable sensitivity settings, typically ranging from 1 mV/division To 5 V/division, using a combination of input attenuators and amplifiers in the signal path to an analogue to digital converter (ADC). A fast edge with a wide dynamic range is required to verify the performance of these selectable ranges. Of course, it would be possible to have a fixed amplitude for an, edge, and to effectively vary the amplitude to be applied to the equipment under test by manually attaching different combinations of coaxial attenuators to the output of the test signal generator. However, this is inconvenient in the context of automated calibration and verification of electronic equipment, for example when oscilloscopes are being manufactured or serviced.

An example of a commercially available advanced automated oscilloscope calibrator is that sold by Wavetek Corporation as model number 9500. This is a fully automated solution for oscilloscope calibration that provides many different waveforms and functions, including test signals with 150 ps edges, both rising and falling and with variable amplitudes ranging from 4.44 mV to 3.1 V. Such test signals are suitable for calibrating an oscilloscope having an input bandwidth of up to 2 GHz to 3 GHz. The edges produced by the model 9500 calibrator are ground-returning, whether rising or falling. This reduces the possibility of longer term changes in calibrator performance, since ground is a well-defined level.

A fast edge generator with wide dynamic range, such as say 60 dB, typically consists of a source whose dynamic range is about 10 dB followed by relay-switched attenuators, each attenuator having a resistor network. The performance that can be achieved with this design approach is limited not by the source itself, but by parasitic inductance and capacitance within the relays. These parasitics, which can be thought of as a departure from an ideal 50Ω impedance transmission line, cause ringing and a loss of bandwidth in the test signal available from the output of the test signal generator. The best dual changeover relays currently available have an effective rise time of 50 ps each, equivalent to about 7 GHz, so that three attenuators in series would slow an infinitely fast edge to 87 ps. In addition, the materials used in the construction of these relays cause losses due to skin effect, resulting in a phenomenon called 'dribble-up'. This gives a rounded corner after the edge, consistent with increasing loss at increasing frequency. This can be compensated for using networks of passive components, but tends to result in a loss of overall edge amplitude by as much as 25%. Furthermore, inexact compensation of such a large error adds to aberration uncertainties in the test signal edges.

SUMMARY OF THE INVENTION

It is an object of the present invention to provide an improved test signal generator.

Accordingly, the invention provides an electronic circuit for generating an electronic fast edge waveform of selectable amplitude, comprising: a waveform output from the circuitry; a plurality of attenuation stages, the attenuation stages being connected without any switching elements to each other to form a cascaded series of attenuation stages leading to the waveform output and each of the attenuation stages in the series being bounded by circuit nodes; or more pulse generators for producing an unattenuated source of the fast edge waveform; and means for selectively applying the fast edge waveform source to any selected one of the circuit nodes so that the fast edge waveform propagates from the selected circuit node through a selected number of attenuation stages to the waveform output thereby attenuating the fast edge.waveform to a selected amplitude.

In this specification, the term "fast edge" means an edge faster than about 350 ps, this being the rise or fall time equivalent to about 1 GHz.

An unattenuated fast edge waveform may be provided at the circuit output if one of the circuit nodes is after the last attenuation stage before the circuit output.

In a preferred embodiment of the invention, the attenuation stages are hardwired to each other. It would however, be possible to place certain types of passive component between the stages, for example a resistor or a coupling capacitor, as long as there are no relays or other types of switching elements such as diodes.

Because the attenuation stages are hardwired to each other in the sense that there are no relays or other switching elements between the attenuation stages, stray capacitance associated with such switching elements is avoided. As a result, degradation in the rise or fall times of the fast edge waveform is reduced.

In a preferred embodiment of the invention, there are a plurality of pulse generators, each pulse generator being individually activatable and connected to a different one of the circuit nodes, the means for selectively applying the fast edge waveform source to a corresponding selected one of the circuit nodes involving the selective activation of a selected pulse generator.

It would, however, be possible for there to be one or more pulse generators if there is a switching circuit between a pulse generator and a plurality of circuit nodes, the means for selectively applying the fast edge waveform source to a corresponding selected one of the circuit nodes involving the selective switching of the fast waveform source from said pulse generator via the switch to a selected one of the circuit nodes.

Although the switching element would introduce some additional stray capacitance, this would be less than in a conventional design in which relays have to be provided in series between successive attenuation stages. Such a switching element used with one pulse generator may also be more economical than a large number of pulse generators.

Preferably, pulse generators of opposite polarity are paired in connection to said circuit nodes. Thus both rising and falling fast edges can be produced from the same circuit.

In a preferred embodiment of the invention, each attenuation stage provides the same degree of attenuation to the fast edge waveform.

Each attenuation stage will provided discrete changes in waveform attenuation, for example with steps of 10 dB for every additional attenuation stage through which the fast edge waveform travels on its way to the circuit output. If a more continuous degree of attenuation is needed, then the pulse generator may be made so that it is operable to vary the amplitude of the fast edge waveform source. In a preferred embodiment of the invention, this is dote by varying the supply voltage to the pulse generator. Preferably, this ability to vary the amplitude of the fast edge waveform, is sufficient to span the discrete steps provided by the attenuation stages, so that any desired degree of attenuation can be selected between the attenuation steps.

The invention also provides a test signal generator for generating a fast edge electronic waveform, comprising electronic pulse generation circuitry according to the invention.

BRIEF DESCRIPTION OF THE DRAWINGS

The invention will now be described by way of example, with reference to the accompanying drawings, in which.

DETAILED DESCRIPTION

Figure 1:
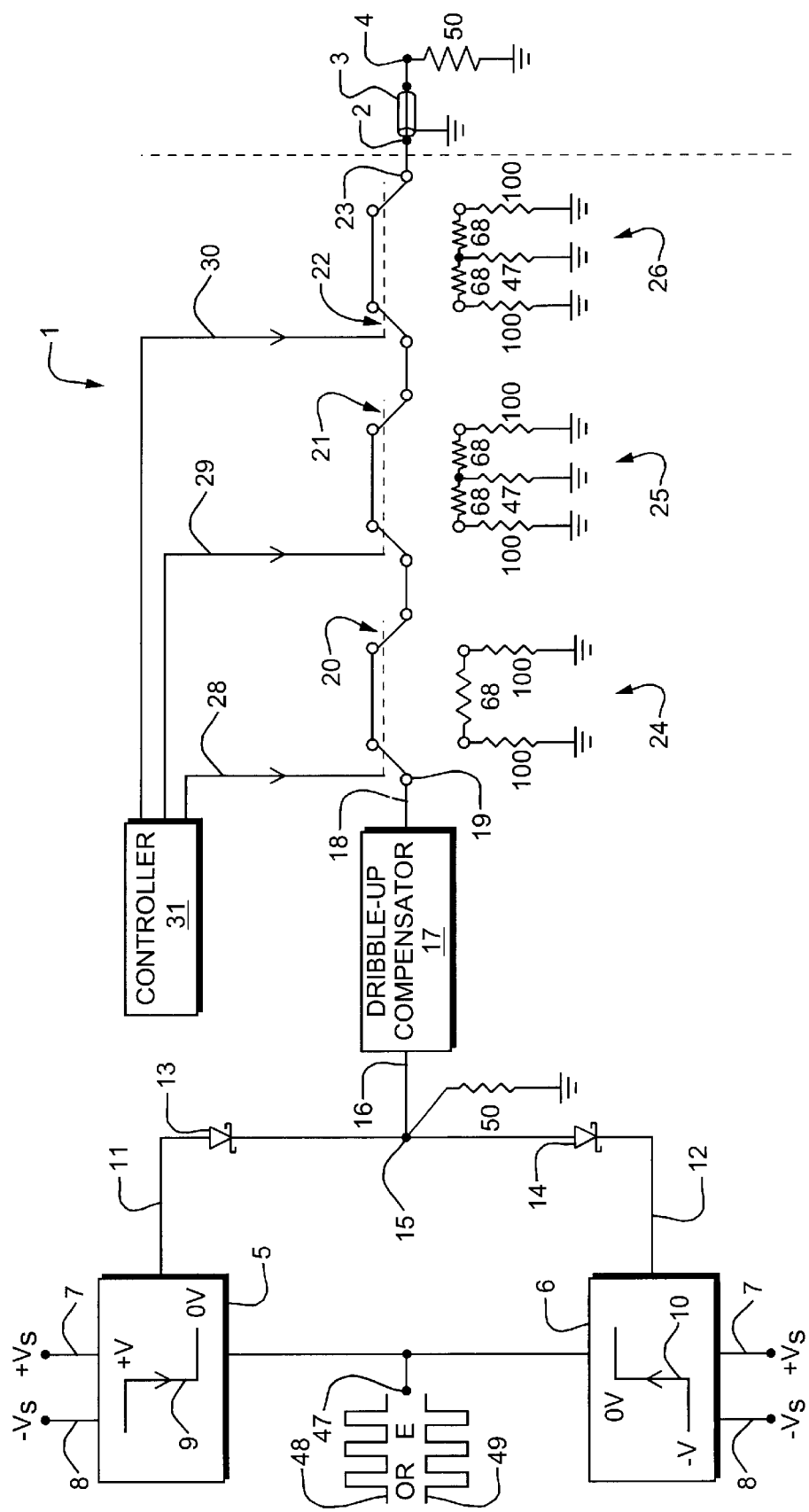
FIG. 1 is a schematic block diagram of a prior art electric circuit for generating an electronic fast edge waveform of selectable amplitude.

FIG. 1 shows a schematic block diagram of a prior art electronic circuit 1 for generating an electronic fast edge waveform of selectable amplitude. This circuit 1 has an output 2 that can be connected via a suitable connector or coaxial line 3 to the input 4 of equipment under test, for example an oscilloscope (not shown). The circuit 1 comprises a pair of pulse generators 5, 6 of opposite polarity. Both pulse generators 5, 6 are connectable to positive and negative power supply rails 7, 8, and to an enable input (E) 47 to which is applied either a positive-going pulsed waveform 48 or a similar negative-going pulsed waveform 49. The pulsed waveforms 48, 49 have an adjustable frequency of between 10 Hz and 2 MHz with a 10% duty cycle. The rise and fall times of the pulsed waveforms is modest at about 1 ns.

When both of the pulse generators 5, 6 are energised at the power rails 7, 8, either the positive-going waveform 48 or the negative-going waveform 49 is applied to the pulse generators 5, 6 via the enable input 47. One pulse generator 5 is only activated by the positive-going pulses, and the other pulse generator 6 is only activated by the negative-going pulses so that just one of the pulse generators 5, 6 is active at any time when either of the pulses 48, 49 is present at the enable input 47.

The pulse generators each produce pulses at a pulse generator output 11, 12 that follow the input positive-going and negative-going pulses 48, 48, but with faster falling or rising edges 9, 10 with a speed of less than 100 ps. The voltage on the power rails 7, 8 can be varied to vary the dynamic range of the fast edge 9, 10 by about 10 dB. Each output 11, 12 is wired to a reverse-biased beam-lead silicon Schottky diode 13, 14.

The opposite terminal of the diodes 13, 14 is connected to a node 15 at a transmission line 16 having 50Ω impedance. The fast edge waveform 9, 10 is transmitted on line 16 first to a "dribble-up" compensator 17 that is used to compensate for rounding of fast edge waveform edges, as will be explained below.

An output 18 from the dribble-up compensator 17 goes to one pole 19 of a ganged double-pole double-throw relay, indicated generally as 20. In the relay position as drawn, the line 18 is wired straight through to two following similar relays 21, 22, also shown in the position where the line is wired straight through each relay. The final relay 22 has one pole 23 wired directly to the circuit output 2. Therefore, as drawn the fast edge waveform after the dribble-up compensator 17 is wired straight through to the output 2 with no significant attenuation.

When any of the relays 20, 21, 22 is switched to the other position, then a corresponding attenuation stage 24, 25, 26 is connected in series with the transmission line 16 and circuit output 2. The first attenuation stage 24 has a passive network of resistors that provide 10 dB attenuation. The following two attenuation stages 25, 26 each have resistor networks equivalent to two of the first stage's resistor networks so that the attenuation for each of the second and third stages 25, 26 is 20 dB. Therefore, the relays 20, 21, 22 and attenuation stages 24, 25, 26 provide attenuation between 0 dB and 50 dB depending on the switching of the relays 20, 21, 22.

Each relay 20, 21, 22 is connected via a corresponding control line 28, 29, 30 to a controller 31. The circuit 1 may be part of a test signal generator (not shown) with front panel controls by which the controller 31 is activated to switch the relays 20, 21, 22 to provide a desired-attenuation of the fast edge waveform 9, 10.

Each of the relays 20, 21, 22 introduces stray capacitances and inductances to the transmission line 16. In addition, the materials used in the construction of relays cause losses due to skin effect. This results in a phenomenon called "dribble-up", which is a rounding of edge corners.

This can be compensated for to some degree by the dribble-up compensator 17, but at the cost of a loss of edge amplitude of as much as 25%. In practice the prior art fast edge pulse generator is limited to a maximum bandwidth of about 3 GHz.

Figure 2:
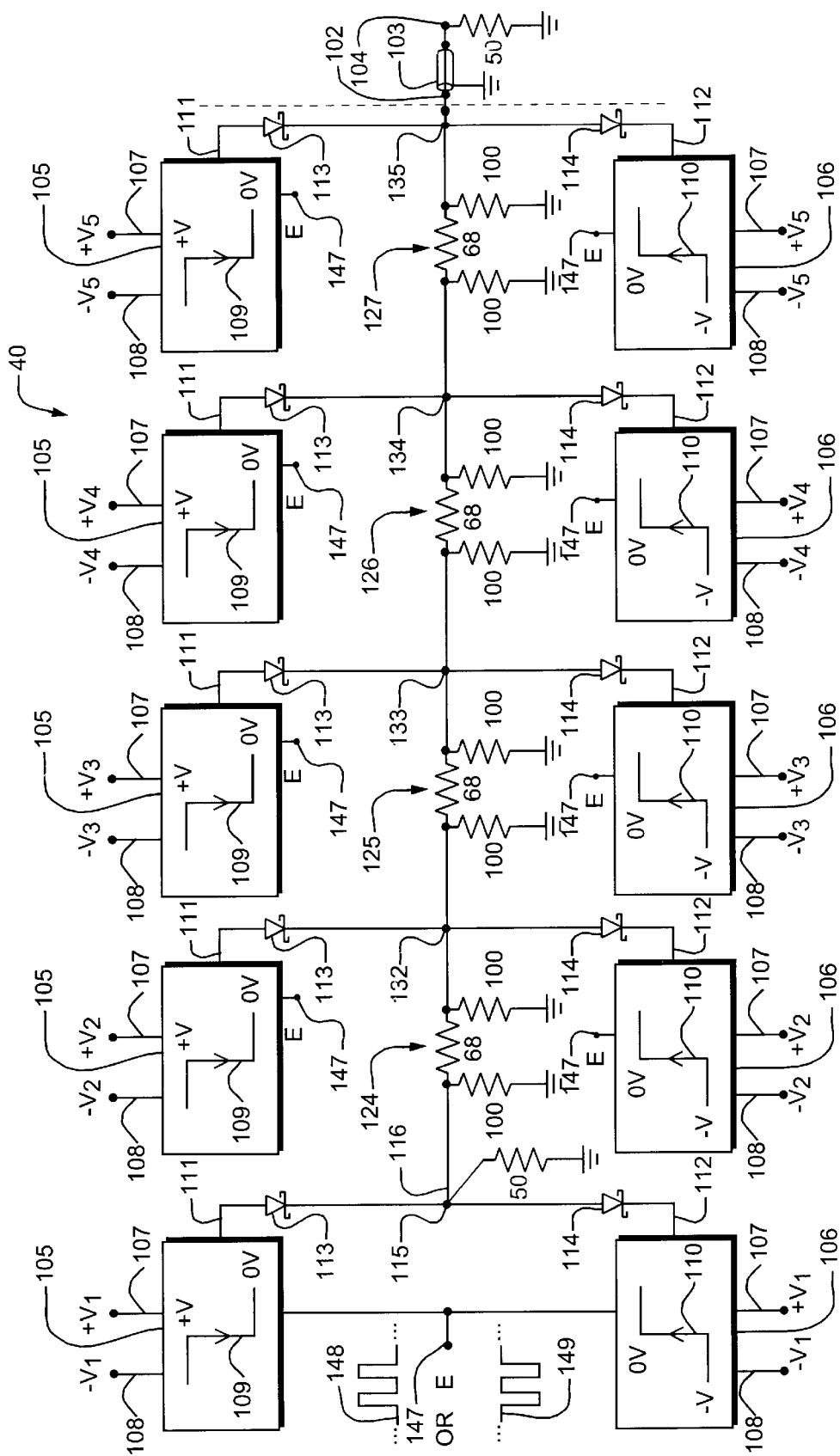
FIG. 2 is a schematic block diagram of an electronic circuit according to the invention, for generating an electronic fast edge waveform of selectable amplitude, having five pairs of pulse generators of opposite polarity, each pulse generator being individually activatable.

FIG. 2 shows a schematic block diagram 40 of an electronic circuit according to the invention, for generating an electronic fast edge waveform of selectable amplitude. Circuit components in the circuit 40 which correspond with those in the prior art circuit 1 are given the same reference numerals incremented by 100. The circuit 40 has five identical pairs of pulse generators 105, 106. Each pair of these can be individually and selectively connected via positive and negative supply lines 107, 108 to a voltage source. When a pair of pulse generators 105, 106 is so energised, one of the pulse generators can be activated by either the positive-going or negative-going waveforms 148, 149 when one of these is applied to the enable input 147 of the pulse generators 105, 106. This produces a fast edge waveform with either a falling edge 109 or a rising edge 110 having a speed less than 100 ps. Each of these edges is ground-returning to reduce uncertainties due to the effect of longer term shifts in level. The magnitude of the positive and negative voltage supply 107, 108 can be varied in order to vary the amplitude of the fast edge 109, 110 by up to 10 dB.

Each pulse generator 105, 106 has an output 111, 112 connected to a reverse-biased beam-lead silicon Schottky diode 113, 114. The other side of each diode 113, 114 is connected to a node 115 at one end of a transmission line 116. The node 115 is an input node to a first attenuation stage 124 of a series of four attenuation stages 124, 125, 126, 127 that are hardwired in series to a circuit output 102. The attenuation stages 124–127 are therefore cascaded, that is with one attenuation stage leading directly to an adjacent attenuation stage. Each attenuation stage has an input node and an output node 115, 132, 133, 134, 135 that bound each attenuation stage 124–127. Because there are no circuit elements between successive stages, the output node of one stage is the input node of the successive stage. At each one of these circuit nodes 115, 132–135 is wired one pair of pulse generators 105, 106. Physically, the nodes are short lengths of 50Ω transmission line, and the connections from the pulse generators 105, 106 to the line can be made at any point along the length of the line.

It will be noted that the circuit has no dribble up compensation.

Each attenuation stage provides 10 dB of attenuation, so that the fast edge waveform 109, 110 is attenuated by up to 40 dB depending on the number of attenuation stages 124–127 that the selected fast edge waveform 105, 106 passes through on its way to the output 102. One circuit node 135 is connected directly to the output 102, so that if either of the pulse generators 105, 106 connected to the circuit node 135 is activated, then this fast edge waveform 109, 110 will have no attenuation. Each subsequent pair of pulse generators 105, 106 is connected to the output 102 via an additional attenuation stage, so that the pair of pulse generators 105, 106 furthest from the output 102 provides a fast edge waveform that-is attenuated by 40 dB at the output 102.

With five such pairs of pulse generators and four cascaded attenuation stages, the amplitude of the fast edge waveform at the output 102 can be stepped over a significant range, for example between 7 mV to 2.2 V.

Figure 3:
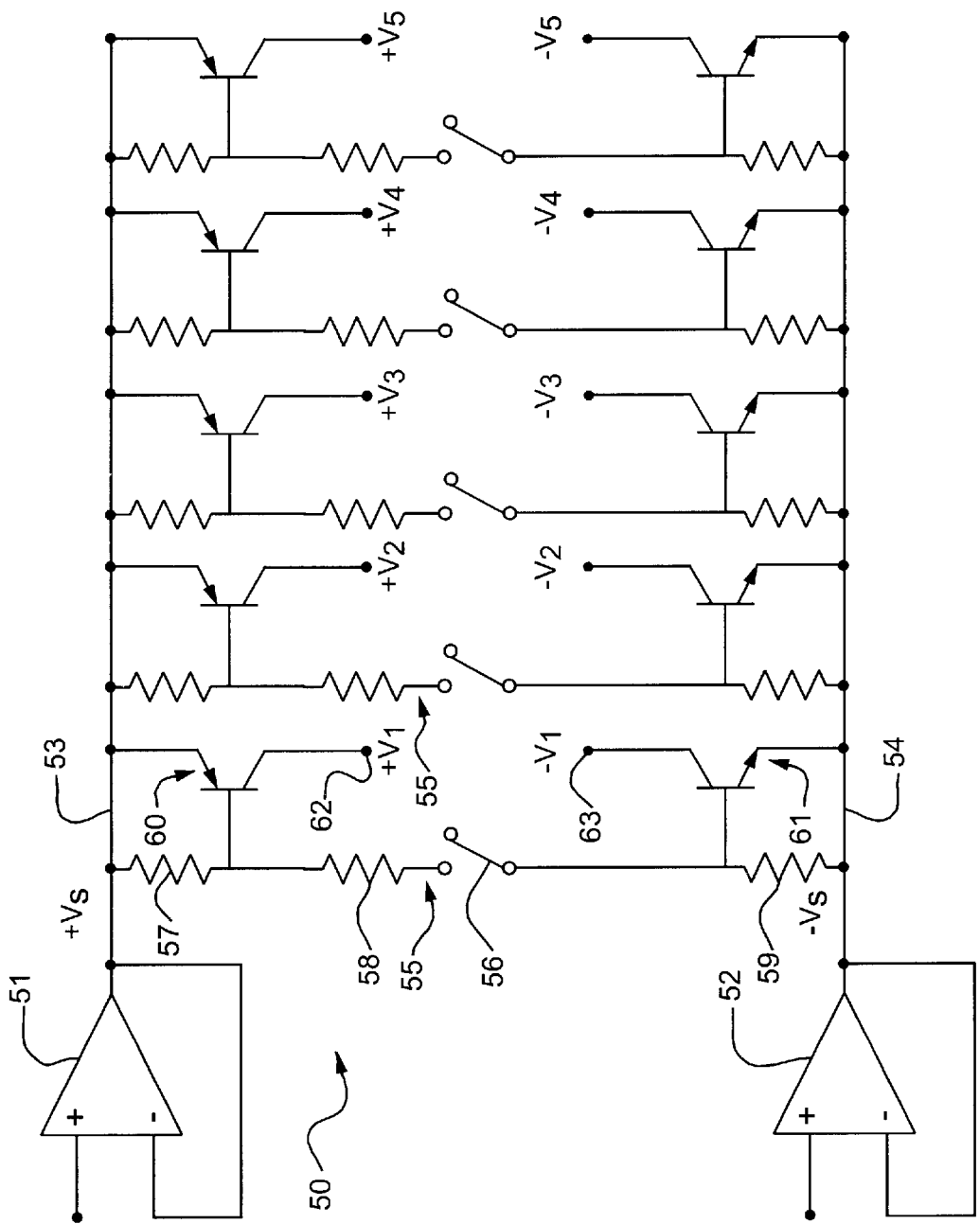
FIG. 3 is a schematic block diagram of a circuit for individually activating the pulse generators of FIG. 2.

In the electronic circuit of FIG. 2, only one pulse generator is activated at a time. FIG. 3 shows a circuit 50 that may be used with the electronic circuit of FIG. 2 to enable individually each pulse generator 105, 106, with the remaining pulse generators being disabled. Two adjustable and stabilised power supplies 51, 52 are used to provide a positive supply voltage $+V_S$ and a negative supply voltage $-V_S$ on corresponding power rails 53, 54. Between the power rails 53, 54 are five similar switching circuits 55 in parallel with each other. Each switching circuit 55 has a single-pole single-throw switch 56, which when closed allows current to flow through the switch 56 and three resistors 57, 58, 59 all in series between the power rails 53, 54. Voltages generated across the resistors switch are applied to the bases of two transistors 60, 61, each with an emitter connected to the power rails 53, 54. The transistors 60, 61 when switched on by these voltages produce respectively appositive voltage $+V_n$ and a negative voltage $-V_n$ (here n=1 . . . 5) at positive and negative connection points 62, 63 that are connected to one pair of the pulse generators 105, 106 of FIG. 2. Therefore, by switching on just one of the five switches 56, one of the pulse generators 105, 106 can be activated.

Returning now to consider FIG. 2, when a pulse generator 105, 106 is off, the stray capacitance presented to the attenuator chain 124–127 by any of the pulse generators 105, 106 is minimal, approximately 0.1 pF from each reverse biased diode 113, 114. When both polarities of edge are provided as shown in FIG. 2, each pair of pulse generators 105, 106 adds 0.2 pF per node. With the nodal impedance being 25Ω, this gives poles at 32 GHz. A higher bandwidth can be provided if GaAs Schottky diodes are used, as these have only half the capacitance of silicon diodes. In practice, the circuit of FIG. 2 can be used to generate a fast edge waveform with a bandwidth equivalent to about 20 GHz, a figure limited at present by current diode technology.

The maximum amplitude provided by each pulse generator depends on the current that it can supply into the 25Ω of the transmission line 116. In practice, a suitable fast edge pulse generator can supply about 100 mA, implying a maximum amplitude of about 2.5 V. When the supply voltages $+V_n$ and $-V_n$ are reduced, the relatively fixed level of charge injection through the capacitance of the diode as it switches off causes the aberrations to be progressively greater as the edge amplitude is reduced. In practice, this gives a lower amplitude limit of about 0.5 V.

The circuit described above can be used to provide an attenuatable fast edge waveform with a rise or fall time equivalent to a bandwidth that lies in the range of about 1 GHz to about 20 GHz.

Although the invention has been described with reference specifically to attenuation stages having a network of resistors, other types of attenuation stage may be useful, depending on the particular test or measurement application. For example, it is known to use variable PIN diode based attenuators. Although such attenuators are not suitable for testing of oscilloscopes for the reason that they do not work at very low frequency, these allow each attenuation stage to have an attenuation variable over a certain range, for example 10 dB.

It is to be recognized that various alterations, modifications, and/or additions may be introduced into the constructions and arrangements of parts described above without departing from the spirit or ambit of the present invention.

What is claimed is:

1. An electronic circuit for generating an electronic fast edge waveform of selectable amplitude, comprising: a waveform output from the circuitry; a plurality of attenuation stages, each of the plurality of attenuation stages being connected to another adjacent attenuation stage without any intervening switching element to form a cascaded series of attenuation stages leading to the waveform output and each of the attenuation stages in the series being bounded by circuit nodes; one or more pulse generators for producing an unattenuated source of the fast edge waveform; and means for selectively applying the fast edge waveform source to any selected one of the circuit nodes so that the fast edge waveform propagates from said selected circuit node through a selected number of attenuation stages to the waveform output thereby attenuating the fast edge waveform to a selected amplitude.

2. An electronic circuit as claimed in claim 1, in which there are a plurality of pulse generators, each pulse generator being individually activatable and connected to a different one of the circuit nodes, the means for selectively applying the fast edge waveform source to a corresponding selected one of the circuit nodes involving the selective activation of a selected pulse generator.

3. An electronic circuit as claimed in claim 1, comprising a switching circuit between a pulse generator and a plurality of circuit nodes, the means for selectively applying the fast edge waveform source to a corresponding selected one of the circuit nodes involving the selective switching of the fast waveform source from said pulse generator via the switch to a selected one of the circuit nodes.

4. An electronic circuit as claimed in claim 1, in which pulse generators of opposite polarity are paired in connection to said circuit nodes.

5. An electronic circuit as claimed in claim 1, in which each attenuation stage provides the same degree of attenuation to the fast edge waveform.

6. An electronic circuit as claimed in claim 1, in which the circuit has no dribble up compensation.

7. An electronic circuit as claimed in claim 1, in which the pulse generator is operable to vary the amplitude of the fast edge waveform source.

8. An electronic circuit as claimed in claim 1, in which the rise or fall time of the fast edge waveform is equivalent to a bandwidth that lies in the range of about 1 GHz to about 20 GHz.

9. An electronic circuit as claimed in claim 1, in which each attenuation stage is hardwired to an adjacent attenuation stage.

10. A test signal generator for generating a fast edge electronic waveform, comprising electronic pulse generation circuitry, said circuitry comprising a waveform output from the circuitry; a plurality of attenuation stages, each of the plurality of attenuation stages being connected to another adjacent attenuation stage without any intervening switching element to form a cascaded series of attenuation stages leading to the waveform output and each of the attenuation stages in the series being bounded by circuit nodes; one or more pulse generators for producing an unattenuated source of the fast edge waveform; and means for selectively applying the fast edge waveform source to any selected one of the circuit nodes so that the fast edge waveform propagates from said selected circuit node through a selected number of attenuation stages to the waveform output thereby attenuating the fast edge waveform to a selected amplitude.

* * * * *